United States Patent
Boggs et al.

(10) Patent No.: US 7,084,354 B2
(45) Date of Patent: Aug. 1, 2006

(54) PCB METHOD AND APPARATUS FOR PRODUCING LANDLESS INTERCONNECTS

(75) Inventors: David W. Boggs, Hillsboro, OR (US); Daryl A. Sato, Beaverton, OR (US); John H. Dungan, Hillsboro, OR (US); Gary I. Paek, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 10/173,329

(22) Filed: Jun. 14, 2002

(65) Prior Publication Data
US 2003/0231474 A1    Dec. 18, 2003

(51) Int. Cl.
*H05K 1/11* (2006.01)
*H05K 1/14* (2006.01)

(52) U.S. Cl. ............... 174/262; 174/260; 29/830; 361/803

(58) Field of Classification Search ............... 361/748, 361/760, 772, 777, 779, 761, 790, 792, 794, 361/780, 736, 8; 174/255–266, 250, 251; 29/830
See application file for complete search history.

(56) References Cited

U.S. PATENT DOCUMENTS

| | | | | |
|---|---|---|---|---|
| 4,426,548 A * | 1/1984 | Oritsuki et al. | ............ | 174/72 R |
| 4,667,404 A * | 5/1987 | Reisman et al. | ............... | 29/847 |
| 4,764,644 A * | 8/1988 | Reisman et al. | ............ | 174/253 |
| 5,347,712 A * | 9/1994 | Yasuda et al. | ................ | 29/852 |
| 5,434,751 A * | 7/1995 | Cole et al. | .................. | 361/792 |
| 5,510,580 A * | 4/1996 | Shirai et al. | ................ | 174/262 |
| 5,537,740 A * | 7/1996 | Shirai et al. | .................. | 29/852 |
| 5,662,987 A * | 9/1997 | Mizumoto et al. | .......... | 428/209 |
| 5,883,335 A * | 3/1999 | Mizumoto et al. | .......... | 174/266 |
| 5,956,843 A * | 9/1999 | Mizumoto et al. | ............ | 29/852 |
| 6,091,027 A * | 7/2000 | Hesselbom et al. | ......... | 174/255 |
| 6,111,205 A | 8/2000 | Leddige et al. | | |
| 6,181,569 B1 * | 1/2001 | Chakravorty | ............... | 361/761 |
| 6,326,559 B1 * | 12/2001 | Yoshioka et al. | ........... | 174/261 |
| 6,340,841 B1 * | 1/2002 | Iijima et al. | ................ | 257/700 |
| 6,365,843 B1 * | 4/2002 | Shirai et al. | ................ | 174/262 |
| 6,441,314 B1 * | 8/2002 | Rokugawa et al. | ......... | 174/255 |
| 6,492,597 B1 * | 12/2002 | Fujii et al. | ................... | 174/255 |
| 6,548,767 B1 * | 4/2003 | Lee et al. | .................... | 174/262 |

(Continued)

FOREIGN PATENT DOCUMENTS

EP    0 373 356 A    6/1990

(Continued)

OTHER PUBLICATIONS

PCT International Search Report for PCT Application No. PCT/US03/15275, mailed Oct. 17, 2003 (8 pages).

*Primary Examiner*—Kamand Cuneo
*Assistant Examiner*—Dameon E. Levi
(74) *Attorney, Agent, or Firm*—Blakely, Sokoloff, Taylor & Zafman LLP

(57) ABSTRACT

An electronic assembly is disclosed. The electronic assembly includes a lower portion and a first elongate trace formed on an upper surface of the lower portion. The trace is covered by an upper portion, and an opening formed through an upper surface of the upper portion extends to the trace to expose a portion of the trace. A second elongate trace is formed on the upper portion. A portion of the second elongate trace positioned in the opening formed through the upper surface of the upper portion contacts the first elongate trace through the opening to form an electrical interconnection between the first trace and the second trace.

26 Claims, 8 Drawing Sheets

U.S. PATENT DOCUMENTS

| | | | |
|---|---|---|---|
| 6,590,165 B1 * | 7/2003 | Takada et al. | 174/266 |
| 6,627,823 B1 * | 9/2003 | Taran et al. | 174/262 |
| 6,924,744 B1 * | 8/2005 | Bohlander et al. | 340/815.45 |
| 2003/0039106 A1 * | 2/2003 | Koyanagi et al. | 361/748 |

FOREIGN PATENT DOCUMENTS

| | | |
|---|---|---|
| EP | 0 727 926 A | 8/1996 |
| EP | 0 740 497 A | 10/1996 |
| GB | 983 846 A | 2/1965 |

* cited by examiner

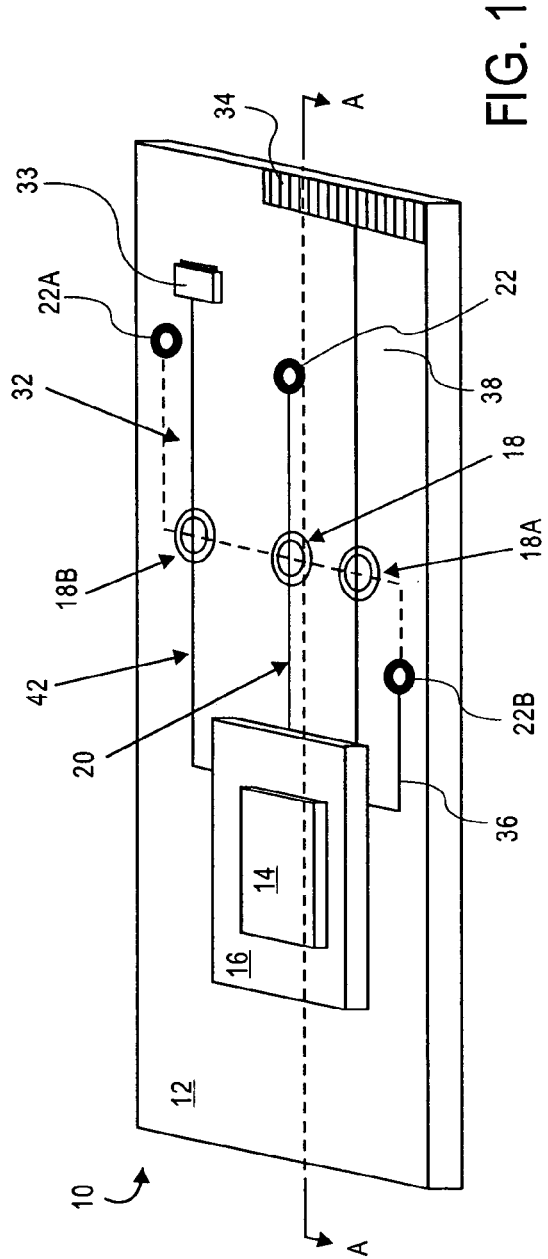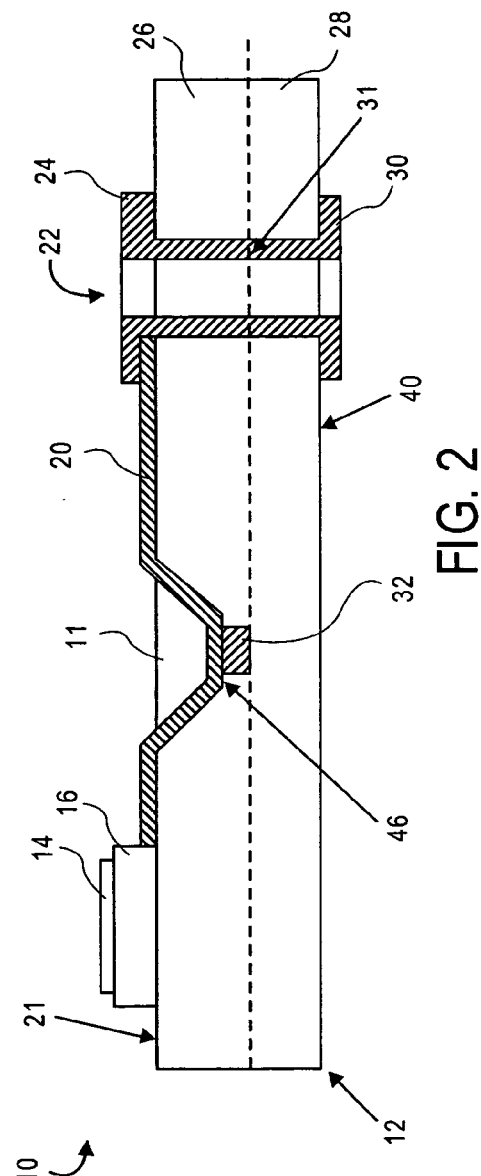

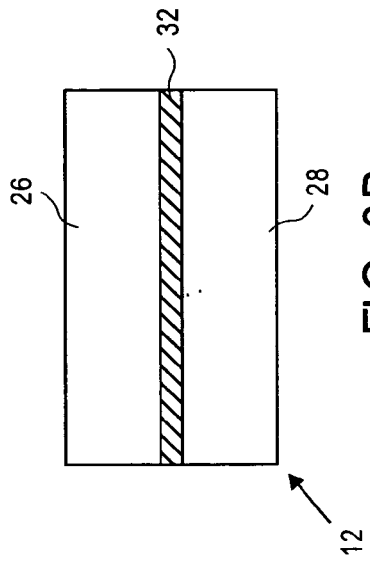
FIG. 3A
FIG. 3B
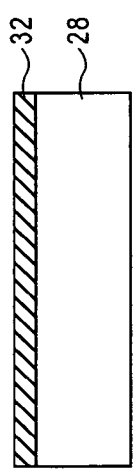
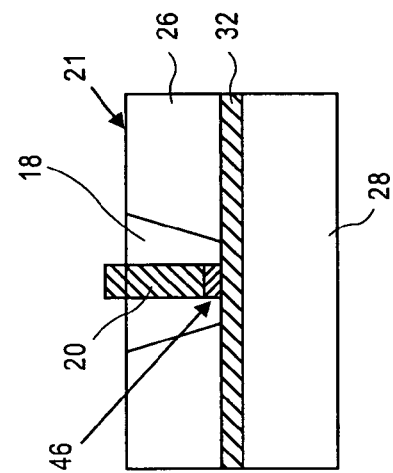
FIG. 3C
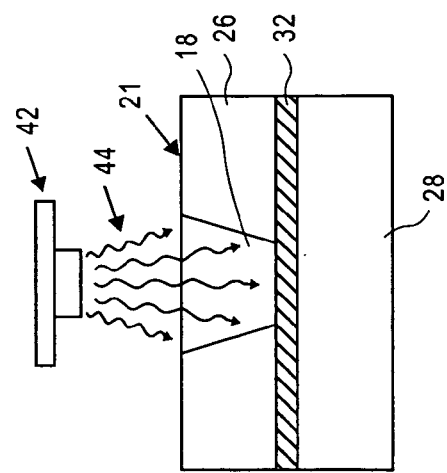
FIG. 3D

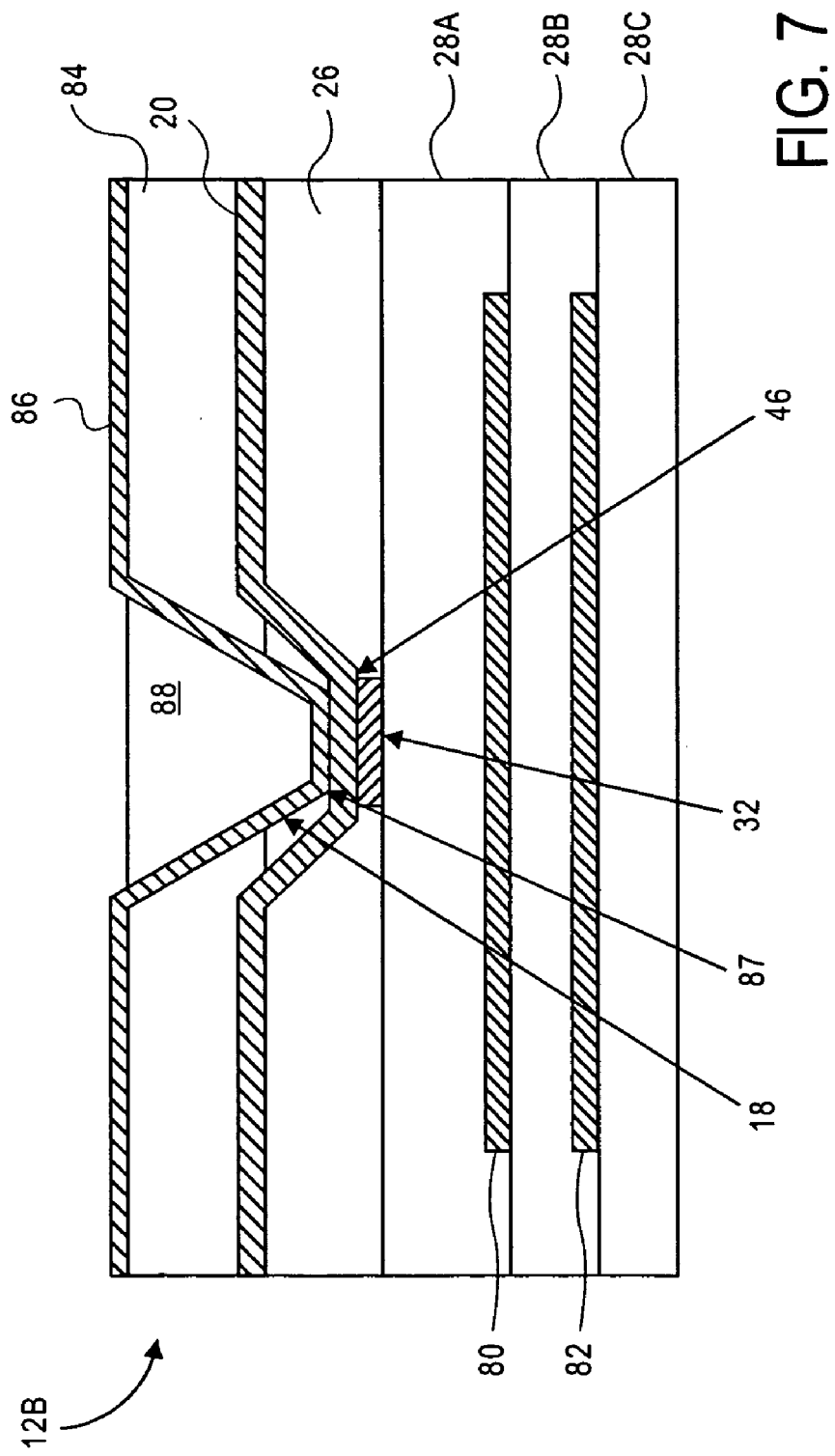

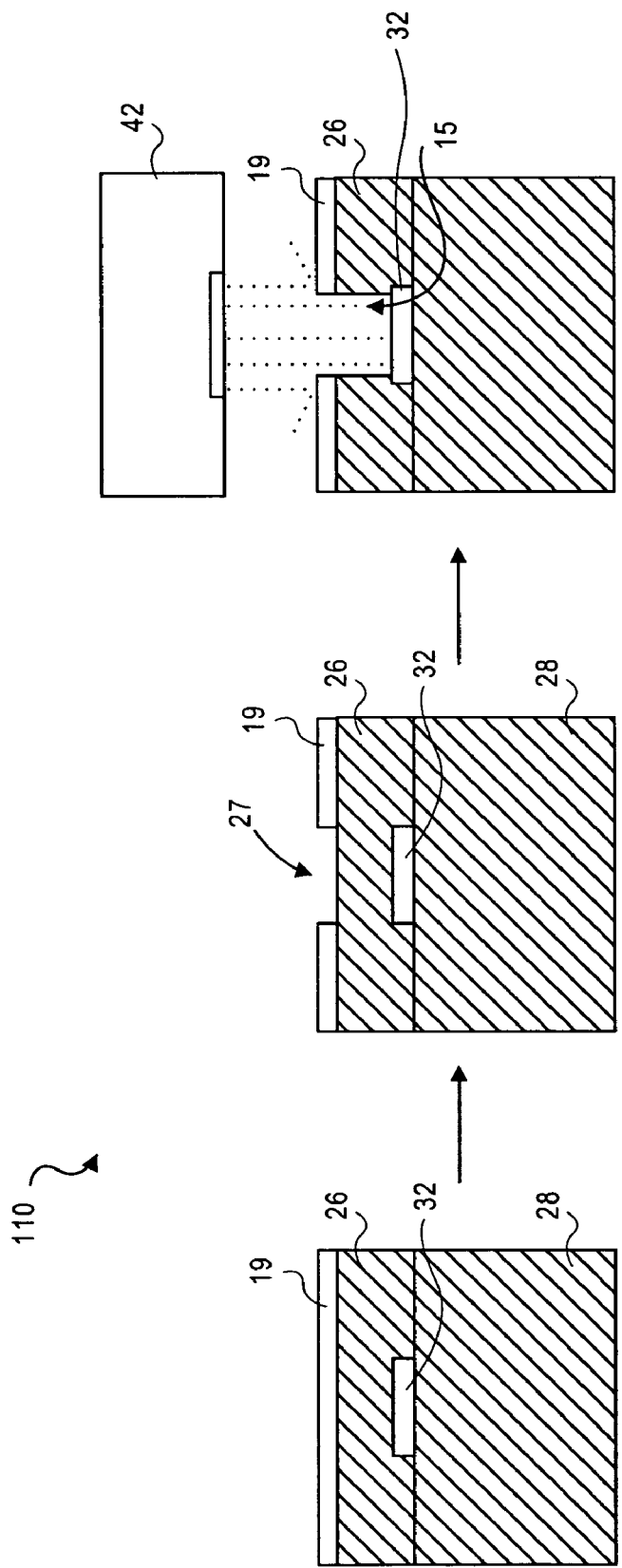

US 7,084,354 B2

PCB METHOD AND APPARATUS FOR PRODUCING LANDLESS INTERCONNECTS

BACKGROUND OF THE INVENTION

1. Field of the Invention

This invention relates to printed circuit boards generally and to the manufacturing of printed circuit boards.

2. Discussion of Related Art

A computer usually has an electronic assembly including a printed circuit board (PCB) and a processor die mounted to the PCB. Electrical components on different layers of the PCB are connected by generally cylindrical openings called vias that are formed through one or more layers of the PCB. The interior of each opening is lined with copper or another electrically conductive material. Metal lands formed on one or more layers of the PCB contact the via's electrically conductive lining and are connected to the PCB's electrical components by metal traces extending between the metal lands and the electrical components. Without the metal lands, it would be difficult, if not impossible, to form the necessary electrical connections.

The traditional approach outlined above is disadvantageous because forming vias consumes space within the PCB. For example, where vias are extended through multiple PCB layers, traces that are formed on the PCB layers and not connected to the vias must be routed around them. Consequently, areas of the PCB become crowded. Including metal lands on the PCB significantly increases the diameter of each via and further complicates the crowding problem. Additionally, forming the metal lands is time consuming and costly.

BRIEF DESCRIPTION OF THE DRAWINGS

Various aspects of the present invention are set forth by way of example, and not limitation, in the figures of the accompanying drawings, in which:

FIG. 1 is a perspective view of a printed circuit board (PCB) having a plurality of landless vias formed therein, according to one embodiment of the invention;

FIG. 2 is a cross-sectional side view of a portion of the PCB of FIG. 1 taken along the line A–A';

FIGS. 3A–3D are diagrams illustrating one embodiment of a method used to form a landless via in a PCB;

FIG. 7 is a cross-sectional side view of a portion of a PCB having two landless vias formed therein, according to another embodiment of the invention;

FIGS. 8–10 are diagrams illustrating one embodiment of a laser cutting process used to form a landless via within a PCB.

DETAILED DESCRIPTION

Figure 4:
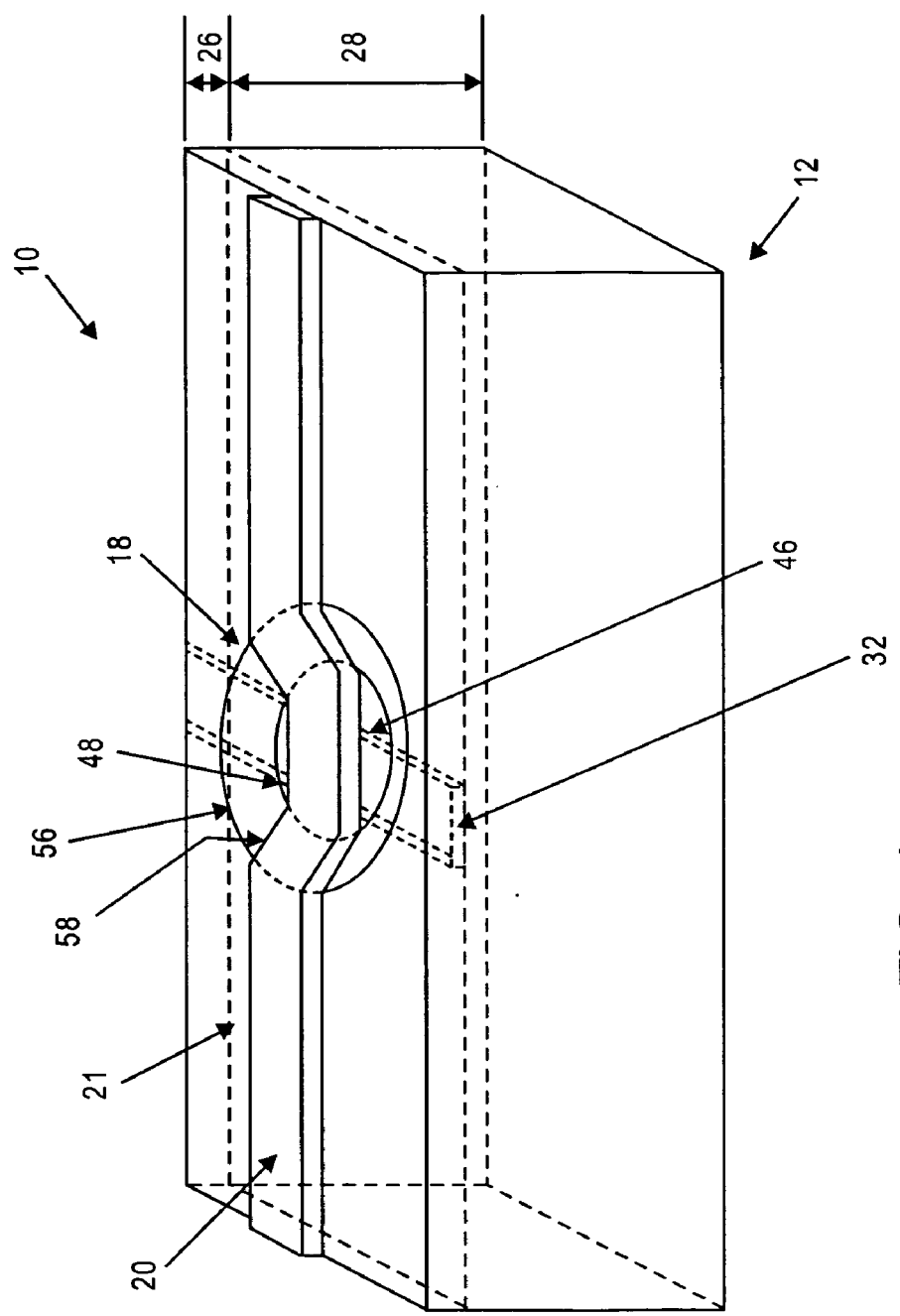
FIG. 4 is a perspective view of a portion of the PCB of FIG. 2, according to one embodiment of the invention.

Referring to FIGS. 1 and 2, an electronic assembly 10 includes a PCB 12, a computer processor 14, a computer processor package 16, a plurality of openings 18, 18A, and 18B, at least one electrical component 33, a card edge connector 34, and a plurality of traces 20, 32, 36, 38, and 42.

As shown in FIG. 2, the PCB 12 is a multilayer substrate formed of a dielectric material. The substrate includes an upper portion 26 and a lower portion 28. A first trace 32 is formed on an upper surface of the lower portion 28, and is covered by the upper portion 26. An opening 18 is formed through an upper surface 21 of the upper portion 26 and extends to the first trace 32 to expose a portion of the first trace 32. A second elongate trace 20 is formed on the upper surface 21 of the upper portion 26. A portion of the second elongate trace 20 is positioned within the opening 18 to contact the exposed portion of the first elongate trace 32 through the opening 18, thereby forming an electrical interconnection 46 between the first elongate trace 32 and the second elongate trace 20.

The traces 20, 32, 36, 38, and 42 are formed of an electrically conductive material such as copper using known plating and imaging techniques. The first elongate trace 32 is connected to the throughholes 22A and 22B shown in FIG. 1. As illustrated in FIG. 2, an exemplary throughhole 22 is an opening formed through the PCB 12 and extending from the top surface 21 of the PCB 12 to a bottom surface 40 of the PCB 12. The interior of the throughhole 22 is lined with an electrically conductive material 31 in the form of copper. The copper 31 contacts a first metal land 24 formed on the top surface 21 of the PCB 12. The copper lining 31 also contacts a second metal land 30 formed on the bottom surface 40 of the PCB 12. Through not shown in FIGS. 1 or 2, the ends of the first elongate trace 32 contact metal lands located within the PCB 12 that connect to the electrically conductive material lining the interior of each of the throughholes 22A and 22B.

Referring again to FIG. 2, the second elongate trace 20 is formed on the top surface 21 of the PCB 12. One end thereof is connected to the computer processor package 16 (hereinafter package 16). The other is connected to a throughhole 22, as previously described, such that an electrical signal can pass between the throughhole 22 and the package 16 over the trace 20. As shown in FIGS. 1 and 2, a middle portion of trace 20 also directly contacts the first trace 32 through the opening 18.

Referring now to FIG. 1, trace 42 connects an electrical component 33 to the package 16. Similarly, the trace 36 connects the package 16 to the throughhole 22B, and trace 38 connects the package 16 to a card edge connector 34. The card edge connector 34 is formed along one edge of an end of the PCB 12. When the end of the PCB 12 is removably inserted within a corresponding socket (not shown), the card edge connector 14 routes signals between the computer processor 14 and other components of the electronic assembly 10 that are connected to the socket.

The computer processor 14 is connected to the package 16 by a plurality of power pins that slidably fit or mate within a corresponding plurality of power sockets formed in the package 16. The package 16, in turn, is connected to traces 20, 32, 36, 38, and 42 that are formed in and on the PCB 12. In this manner, power and data signals are transmitted between the computer processor 14 and various electrical components connected to the PCB 12. The computer processor may include a Pentium processor manufactured by Intel Corporation of Santa Clara, Calif., or similar computer processor.

Still referring to FIGS. 1 and 2, the opening 18 is generally cylindrical in shape, has a top diameter greater than a bottom diameter thereof, and forms a landless via. As used herein, the term "landless via" refers to an opening formed in a surface of a PCB substrate that has no metal land connected to the opening, or to any part of the opening, such as to an electrically conductive material lining an interior of the opening.

FIGS. 3A–3D are diagrams illustrating one method of forming a landless via 18 in a PCB 12, according to one embodiment of the invention. In these figures, manufacturing apparatus such as holding devices, robots, and other machinery is not shown or described in order not to unnecessarily complicate the invention.

In FIG. 3A, a lower portion 28 of a PCB is provided and a first elongate trace 32 is formed thereon using plating and imaging techniques known to persons of ordinary skill in the art. Illustratively, the lower portion 28 is made of a dielectric material. The trace 32 is formed of an electrically conductive material such as copper.

In FIG. 3B, the trace 32 is covered with a second layer of dielectric material that forms the upper portion 26 of PCB 12.

In FIG. 3C, a laser 42 is positioned above the upper portion 26 and activated for a predetermined time. The laser radiation 44 impinges the upper portion 26 and ablates an opening 18 therein which extends to the first elongate trace 32 to expose a portion of the trace 32. The opening 18 is substantially conical in shape, having a top diameter greater in dimension than a bottom diameter thereof. The substantially conical shape is a by-product of the laser manufacturing process and results when material near the top surface 21 of the upper portion 26 continues to ablate during the time it takes the laser radiation 44 to bore through the upper portion 26 and expose a portion of the trace 32. The laser radiation does not ablate the trace 32.

The laser 42 is a solid state or gas laser of the type known in the art that emits visible, ultraviolet, or infrared light. Illustratively, a neodymium: yttrium-aluminum garnet (ND: YAG) laser or ruby laser is used. Alternatively, a Helium-Neon (HeNe) laser or CO2 laser is used.

In FIG. 3D, a second elongate trace 20 is formed on the upper surface 21 of the upper portion 26. A portion of the second elongate trace is positioned in the opening (e.g. landless via) 18 and contacts the first elongate trace 32 through the opening to form an electrical interconnection 46. The traces 20 and 32 are positioned at right angles to each other. The traces 20 and 32 are plated together without using an adhesive.

FIG. 4 is an exploded perspective view of a portion of the electronic assembly 10 and the PCB 12 shown in FIG. 2. The PCB 12 includes an upper portion 26 and a lower portion 28, as previously described. A first elongate trace 32 is formed on an upper surface of the lower portion 28 and is covered by the upper portion 26, so as to be virtually hidden within the PCB 12. An opening 18 is formed in the upper surface 21 of the upper portion 26 and extends to the first elongate trace 32 to expose a portion of the trace 32. A first top diameter 56 is larger than a second bottom diameter 48, and opening 18 has sloped sidewalls 58 that angle downwards from the top diameter 56 to the bottom diameter 48.

A second elongate trace 20 is formed on the top surface 21 and contacts the exposed portion of the first elongate trace 32 through the opening 18. An electrical interconnection 46 is formed between the first elongate trace 32 and the second elongate trace 20. In the present example, the trace 20 is shown positioned transverse the first elongate trace 32. An advantage of having the trace 32 transverse the trace 20 is that the traces 32 and 20 are guaranteed to contact each other. In another embodiment, however, the trace 20 may be positioned such that its longitudinal axis substantially parallels the longitudinal axis of the first trace 32. The trace 20 carries electrical signals between the computer processor 14 (FIG. 1) and a device connected to the trace 32.

Figure 6:
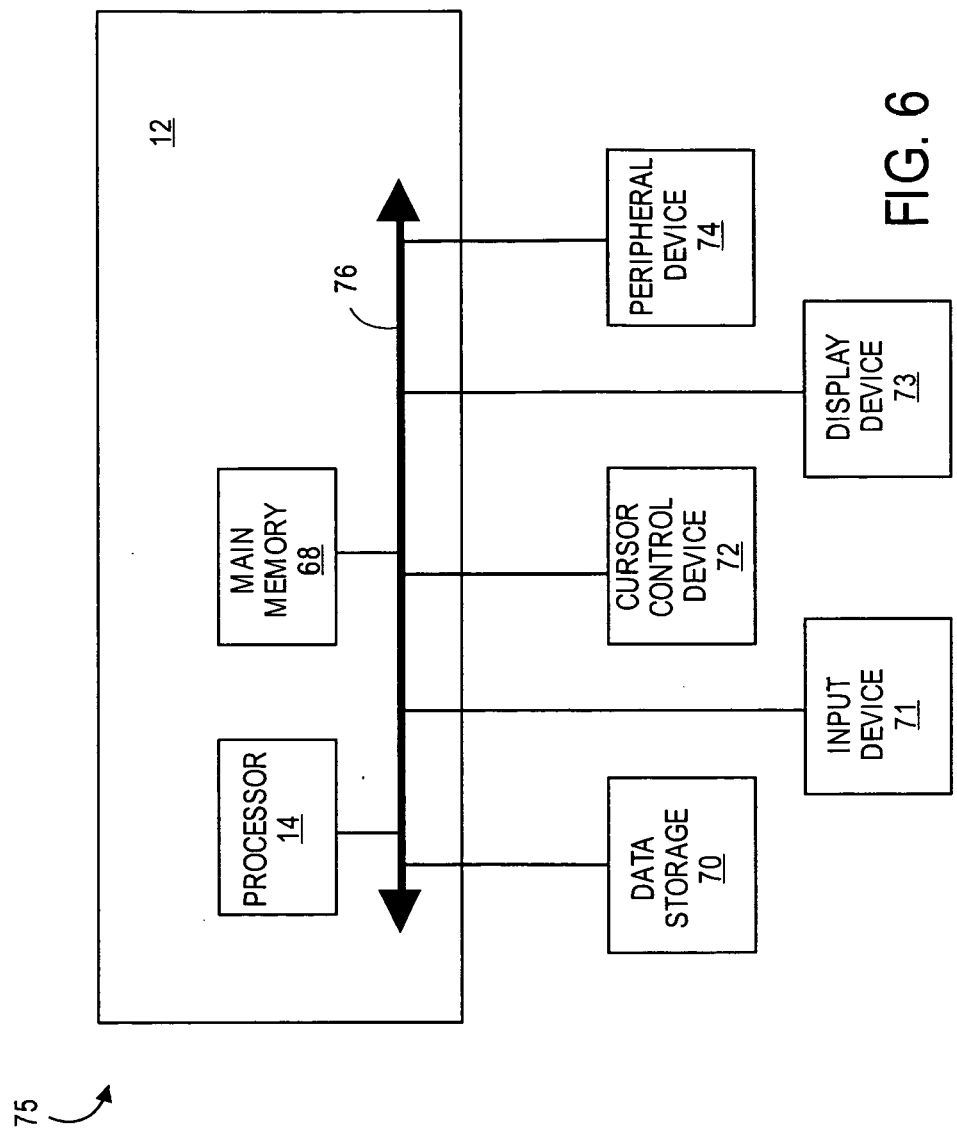
FIG. 6 is a diagram of a computer that may be used with one or more embodiments of the present invention.

FIG. 6 is a diagram of a computer system 75 useable with an embodiment of the present invention. The computer system 75 includes a PCB 12 on which are mounted a processor 14 and a main memory 68. The computer system 75 further includes a bus 76, a data storage device 70, an input device 71, a curser control device 72, display device 73, and a peripheral device 74. As previously described, the PCB 12 includes a trace 20 connected to the processor 14, and further connected to a second trace 32 through a landless opening formed in a top surface of the PCB 12.

The bus 76 connects the processor 14 to the main memory 68. The main memory 68 stores computer executable instructions, which when executed by the processor 14 cause the processor 14 to perform various predetermined tasks. In one embodiment, the main memory 68 is a Random Access Memory (RAM). The bus 76 also connects the computer processor 14 and the main memory 68 to the data storage device 70, the input device 71, the cursor control device 72, the display device 73, and the peripheral device 74, one or more of which are not located on the PCB 12.

The data storage device 70 is a read-only memory device such as a floppy disk, a CD-ROM, or a DVD-ROM, and stores computer executable instructions representing documents, photographs, and other items sent to it by the processor 14. The input device 71 is a keyboard, touch pad, voice-activated controller, or similar device for inputting commands to the processor 14, which commands cause the processor 14 to retrieve and execute the computer executable instructions stored in the main memory 68 and/or in the data storage device 70. The cursor control device 72 is a mouse, a touchpad, or other device for controlling the movement of a cursor that appears on a display device 73 that is connected to the computer system 75. The display device 73 is a flat panel display or other type of display that presents a graphic user interface to a user. The graphic user interface enables a user to interact with the computer system 75 by manipulating objects appearing on the display screen or by entering keystroke, voice, or other commands. The peripheral device 74 is an independent device such as a flatbed scanner, digital camera, or laser printer that removably connects to the computer system 75 to provide added functionality. The data storage device 70, input device 71, cursor control device 72, display device 73, and peripheral device 74 may each include a PCB having one or more landless vias formed therein, as previously described.

In use, (referring back to FIG. 1), electrical signals pass between the computer processor 14 and the electrical component 33, the card edge connector 34, and the throughhole 22 over traces 42, 38, and 20, respectively. Additional electrical signals may pass between the computer processor, the throughhole 22A, the electrical component 33, the throughhole 22, and the edge connector 34 over trace 32, which is buried within the PCB 12. Illustratively, a signal from the processor 14 is routed to each of components 22A, 33, 34, and 22 virtually simultaneously by transmitting the signal over trace 36 to the throughhole 22B, down the throughhole 22B to trace 32, and over trace 32 to traces 38, 20, and 42. At via 18A, the signal transitions to trace 38 and propagates to the card edge connector 34. At via 18, the signal transitions to trace 20 and propagates to the throughhole 22. At via 18B, the signal transitions to the via 42 and propagates to the electrical component 33. Similar signal paths are used to return signals from the components 22A, 33, 34, and 22 to the processor 14.

An advantage of the present invention is that manufacturing times and costs are reduced because electrical interconnections can be formed on different layers of a PCB without using metal lands. Another advantage is that valuable space within a PCB is preserved by forming shallow landless vias. Within the space below the landless vias, additional electrical components or traces can be mounted. Although described herein as being formed using a laser process, the openings 18 and 88 can also be formed using a photo-imageable process. As used herein, the term "elongate" identifies a trace having a length greater than its width.

Figure 5:
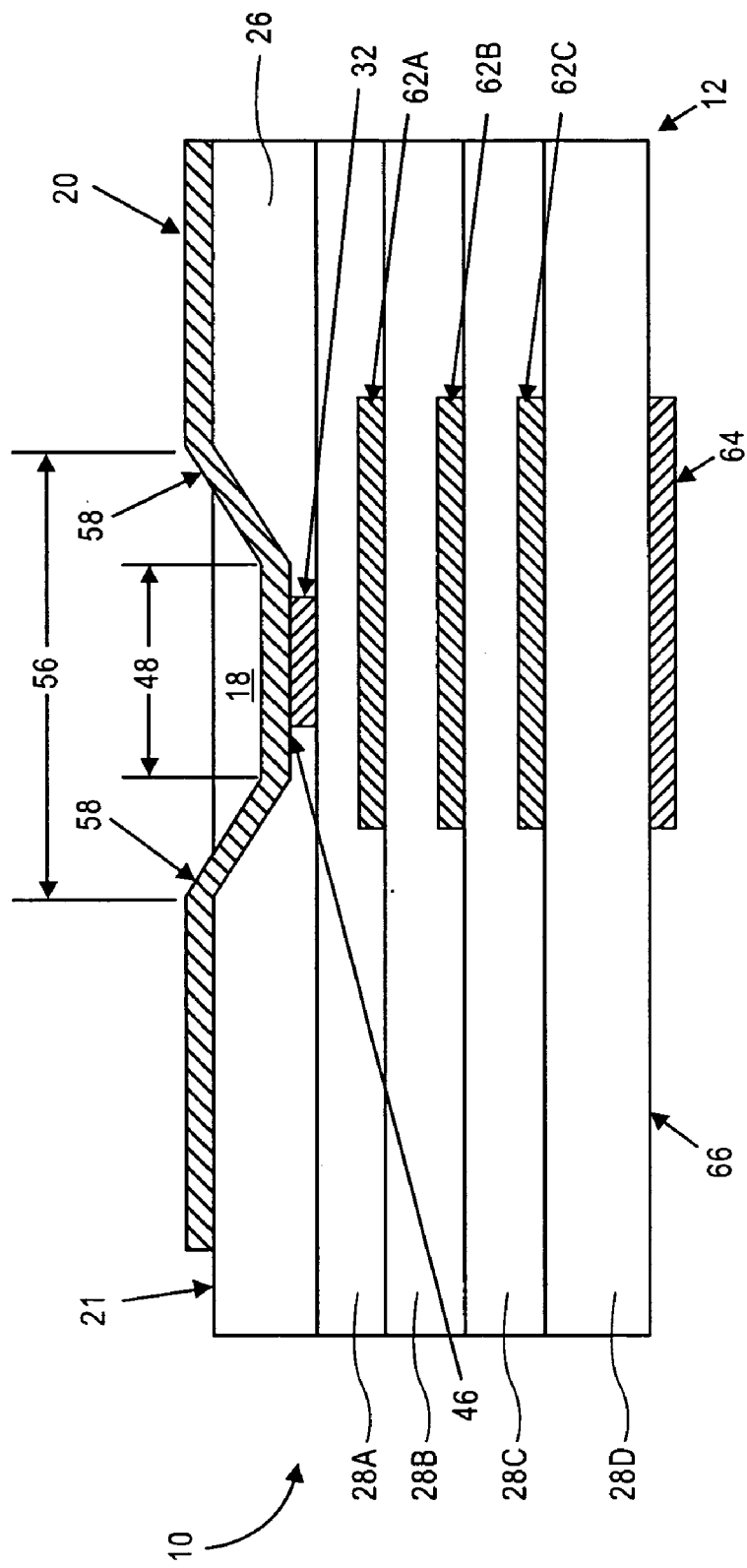
FIG. 5 is a cross-sectional side view of a portion of a PCB showing a plurality of electrical components positioned within the PCB beneath a landless via formed therein.

FIG. 5 is a cross-sectional side view of the electronic assembly 10 and the PCB 12 of FIG. 4, according to another embodiment of the invention. In this embodiment, the PCB 12 is a multilayer substrate comprised of portions of dielectric material 26, 28A, 28B, 28C, and 28D that are laminated together. A trace 62C is formed on an upper surface of the bottom portion 28D. A similar trace 64 is formed on a lower surface 66 of the bottom portion 28D. A first intermediate portion 28C is attached to the upper surface of the bottom portion 28D and covers the trace 62C. Another trace 62B is formed on an upper surface of the first intermediate portion 28C, and is covered with a second intermediate layer 28B. A third trace 62A is formed on an upper surface of the second intermediate layer 28B and is covered with a third intermediate layer 28A.

The first elongate trace 32, previously described, is formed on an upper surface of the third intermediate portion 28A and is covered with an upper portion 26. An opening 18 formed through the top surface 21 of the upper portion 26 extends to the first elongate trace 32 to expose a portion of the trace 32. The opening 18 has a top diameter 56, a bottom diameter 48, and sidewalls 58. The second elongate trace 20, previously described, is formed on the top surface 21 of the PCB 12 and contacts the first elongate trace 32 through the opening 18 to form an electrical interconnection 46. As shown, the opening 18 and the first elongate trace 32 are positioned above traces 62A, 62B, and 62C, which are routed within the PCB 12 beneath the landless via 18.

FIG. 7 is a cross-sectional side view of a PCB 12B, according to another embodiment of the invention. The PCB 12B includes portions of dielectric material 84, 26, 28A, 28B, and 28C. The PCB further includes traces 20, 32, 80, 82, and 86.

The first elongate trace 32 is formed on an upper surface of the intermediate portion 28A and is covered by the upper portion 26, as previously described. A second elongate trace 20 is formed on an upper surface of the upper portion 26 and contacts the first elongate trace 32 through the opening (e.g. landless via) 18, which is formed in the upper surface of the upper portion 26. The second elongate trace 20 is covered by a second upper portion 84, and some of the material forming the second upper portion 84 fills the opening 18.

A second opening (e.g. a second landless via) is formed through an upper surface of the second upper portion 84 and extends to the second elongate trace 20 to expose a portion of the trace 20. A third elongate trace 86 is formed on the upper surface of the upper portion 84 and contacts the second elongate trace 20 through the opening 88.

A fourth trace 82 is formed on an upper surface of the bottom portion 28C and is covered by an intermediate portion 28B. A fifth trace 80 is formed on an upper surface of the intermediate portion 28B and is covered by the intermediate portion 28A. In this manner, valuable space beneath the vias 88 and 18 is utilized without having to route the traces 80 and 82 around the vias 88 and 18.

FIGS. 8–10 are diagrams illustrating one method of a laser cutting process 100. In FIG. 8, a first trace 32 is formed on an upper surface of an inner layer 28, which is made of a dielectric material. The inner layer 28 and the trace 32 are capped with a laminated second layer 26, which is capped with a layer of copper foil 19. The second layer 26 is also made of a dielectric material. In FIG. 9, an opening 27 is formed in the copper foil 19 above the trace 32 using known photolithography techniques. In FIG. 10, a laser 42, of the type previously described, ablates a portion of the dielectric material covering the trace 32 to form an opening 15. The laser radiation ablates only the dielectric material and not the copper foil 19 or the trace 32. Following the laser process, a second trace (not shown) is plated through the opening 15 to electrically contact the trace 32.

Figure 13:
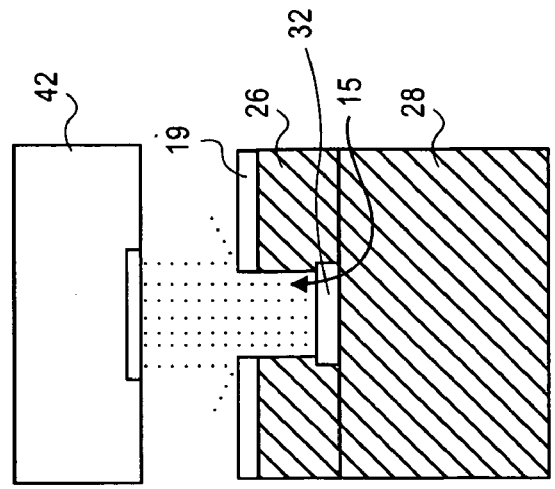
FIGS. 11–13 are diagrams illustrating a second embodiment of a laser cutting process used to form a landless via within a PCB.
Figure 12:
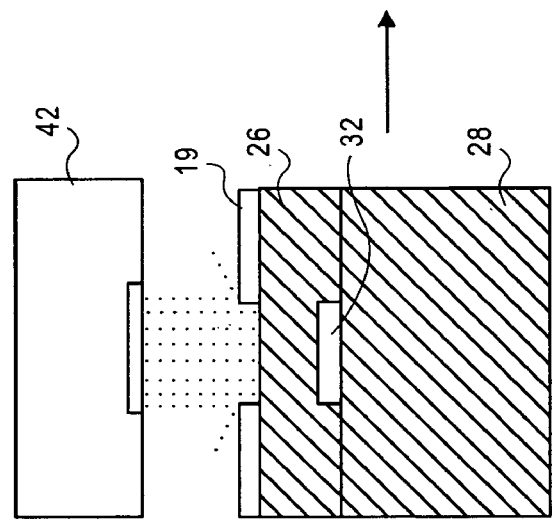
Figure 11:
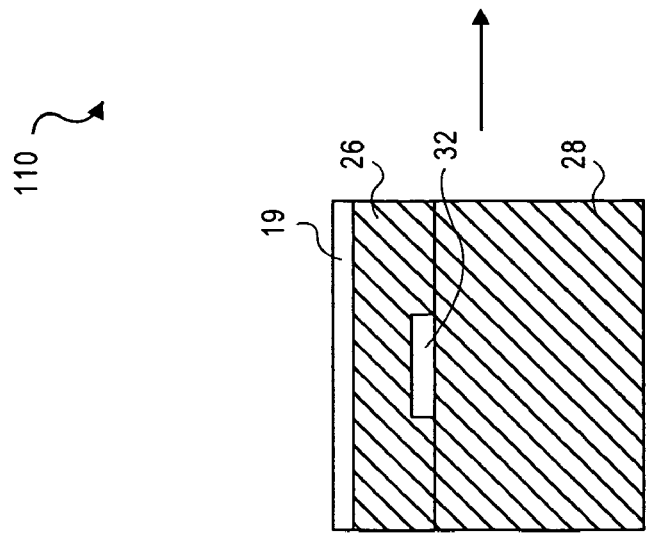

FIGS. 11–13 are diagrams illustrating another method of a laser cutting process 110. In FIG. 11, a first trace 32 is formed on an upper surface of an inner layer 28, which is made of a dielectric material. The inner layer 28 and the trace 32 are capped with a laminated second layer 26, which is capped with a layer of copper foil 19. The second layer 26 is also made of a dielectric material. In FIG. 12, a laser 42 ablates the copper foil 19 in a space above the trace 32. After cutting through the copper foil 19, the laser 42 ablates the dielectric material covering the trace 32 to form an opening 15 (FIG. 13), but does not ablate the trace 32. Following the laser cutting process 110, a second trace is plated through the opening 15 to electrically contact the trace 32. Although the landless via openings described above are illustratively shown having a top diameter greater than a bottom diameter, other embodiments of the invention include landless via openings having top diameters approximately equal to or smaller than the bottom diameters thereof.

While certain exemplary embodiments have been described and shown in the accompanying drawings, it is to be understood that such embodiments are merely illustrative and not restrictive of the current invention, and that this invention is not restricted to the specific constructions and arrangements shown and described hereinabove since modifications may occur to persons ordinarily skilled in the art.

What is claimed is:

1. An electronic assembly, comprising:
    a lower layer;
    a first elongate trace on the lower layer;
    a first upper layer covering the first elongate trace;
    a first via being formed through an upper surface of the first upper layer and extending to the first elongate trace to expose a portion of the first elongate trace in a base of the first via;
    a second elongate trace formed on the first upper layer, the second elongate trace having a first portion and a second portion, wherein the first portion runs over a portion only of the internal sidewall of the first via, and the second portion is positioned in a base of the first via formed through the upper surface of the first upper layer on the portion of the first elongate trace, which is exposed in the base of the first via, to form a direct electrical interconnection between the first elongate trace and the second elongate trace;
    a second upper layer covering the second elongate trace, a second via being formed through an upper surface of the second upper layer above the first via and extending to the second elongate trace to expose the second portion of the second elongate trace; and
    a third elongate trace formed on the second upper layer, the third elongate trace having a third portion and a fourth portion, wherein the third portion covers only a portion of the internal sidewall of the second via, and the fourth portion is positioned in a base of the second via on the second portion of the second elongate trace on the portion of the first elongate trace in the base of the first via, to form a direct electrical interconnection between the third elongate trace, the second elongate trace, and the first elongate trace.

2. The electronic assembly of claim 1, wherein the first elongate trace is connected to a circuiting the electronic assembly.

3. The electronic assembly of claim 2, further comprising:
a computer processor connected to an upper surface of the upper layer and further connected to the second elongate trace.

4. The electronic assembly of claim 1, wherein the lower layer, the first upper layer, and the second upper layer are formed of a dielectric material.

5. The electronic assembly of claim 4, wherein each of the first via and the second via does not have a circular metal land surrouding an opening of the via.

6. The electronic assembly of claim 5, wherein each of the first via and the second via has a first top diameter.

7. The electronic assembly of claim 1, wherein the second elongate trace, the first elongate trace, and the third elongate trace are plated together.

8. The electronic assembly of claim 1, wherein the second elongate trace extends transverse to the first elongate trace.

9. The electronic assembly of claim 1, wherein a length of the second elongate trace is positioned substantially orthogonally to a length of the first elongate trace.

10. The electronic assembly of claim 1, wherein a length of the second elongate trace is positioned substantially parallel a length of the first elongate trace.

11. A method, comprising:
forming a first elongate trace on a lower portion of an electronic substrate;
covering the first elongate trace with a first upper portion of the substrate;
forming a first via through upper surface of the first upper portion, the first via extending to the first elongate trace to expose a portion of the first elongate trace in a base of the first via;
forming a second elongate trace on the upper surface of the first upper portion, the second elongate trace having a first portion and a second portion, wherein forming the second elongate trace includes forming, through an opening in the first via, the first portion on a portion only of the internal sidewall of the first via, and forming the second portion on the portion of the first elongate trace, which is exposed in a base of the first via, to contract the expose portion of the first elongate trace;
forming a second upper portion covering the second elongate trace and a second via through an upper surface of the second upper portion above the first via and extending to the second elongate trace to expose the second portion of the second elongate trace; and
forming a third elongate trace on the second upper portion, the third elongate trace having a third portion and a fourth portion, wherein the third portion covers only a portion of the internal sidewall of the second via, and the fourth portion is positioned in a base of the second via on the second portion of the second elongate trace on the portion of the first elongate in the base of the first via, to form a direct electrical interconnection between the third elongate trace, the second elongate trace, and the first elongate trace.

12. The method of claim 11, wherein the first via is formed after the first elongate trace is formed.

13. The method of claim 11, wherein the first via and the are formed using a laser.

14. An electronic assembly, comprising:
a lower portion;
a first trace on the lower portion; a first upper portion covering the first trace;
a first via being formed through the upper surface of the first upper portion and extending to the first trace to expose a portion of the first trace in a base of the first via;
a computer processor connected to an upper surface of the first upper portion and coupled to a second elongate trace, the second elongate trace having a first portion and a second portion, wherein the first portion runs over a portion only of the internal sidewall of the first via, and the second portion is positioned within a base of the first via on the portion of the first trace, which is exposed in a base of the first via, and contacts the first trace in the base of the first via to form a direct electrical interconnection between the first trace and the second elongate trace;
a second upper layer covering the second elongate trace having a second via being formed through an upper surface of the second upper layer above the first via and extending to the second elongate trace to expose the second portion of the second elongate trace; and
a third elongate trace formed on an upper surface of the second upper layer, the third elongate trace having a third portion and a fourth portion, wherein the third portion covers only a portion of the internal sidewall of the second via, and the fourth portion is positioned in a base of the second via on the second portion of the second elongate trace on the portion of the first elongate trace in the base of the first via, to form a direct electrical interconnection between the third elongate trace, the second elongate trace, and the first elongate trace.

15. The electronic assembly of claim 14, wherein the first trace is connected to a circuit in the electronic assembly.

16. The electronic assembly of claim 15, wherein each of the first via and the second via does not have a circular metal land surrounding an opening of the via.

17. The electronic assembly of claim 15, wherein each of the first via and the second via has a first top diameter greater than a second bottom diameter.

18. The electronic assembly of claim 15, wherein the second elongate trace, the first trace, and the third elongate trace are plated together.

19. The electronic assembly of claim 15, wherein the via is substantially circular.

20. The electronic assembly of claim 14, wherein a length of the second trace is positioned substantially orthogonally to a length of the first trace.

21. The electronic assembly of claim 14, wherein a length of the second elongate trace is positioned substantially parallel a length of the first trace.

22. The electronic assembly of claim 14, further comprising:
a memory connected to the second trace.

23. The electronic assembly of claim 14, further comprising:
an input/output device connected to the second trace.

24. The electronic assembly of claim 1, wherein the second elongate trace includes a third portion running over a portion only of the internal surface of the first via on the opposite side of the opening of the first via relative to the second portion.

25. The electronic assembly of claim 24, wherein the second elongate trace includes a fourth portion and a fifth portion, wherein the fourth portion and the fifth portion are on the upper surface of the upper layer at opposite sides of an opening of the first via.

26. The method of claim 11, wherein forming, through the opening in the first via, the first portion over the portion of the internal surface of the first via, and the second portion in the base of the first via includes plating together the exposed portion of the first elongate trace and the second portion of the second elongate trace.

* * * * *

UNITED STATES PATENT AND TRADEMARK OFFICE
CERTIFICATE OF CORRECTION

PATENT NO. : 7,084,354 B2
APPLICATION NO. : 10/173329
DATED : August 1, 2006
INVENTOR(S) : Boggs et al.

It is certified that error appears in the above-identified patent and that said Letters Patent is hereby corrected as shown below:

In column 7, at line 9, delete "circuiting" and insert --circuit in--.
In column 7, at line 22, after "diameter" insert --greater than a second bottom diameter--.
In column 7, at line 33, after "parallel" insert --to--.
In column 7, at line 51, delete "contract" and insert --contact--.
In column 7, at line 51, delete "expose" and insert --exposed--.
In column 8, at line 55, after "second" insert --elongate--.
In column 8, at line 59, after "parallel" insert --to--.
In column 8, at line 62, after "second" insert --elongate--.
In column 8, at line 65, after "second" insert --elongate--.

Signed and Sealed this

Sixth Day of November, 2007

JON W. DUDAS
*Director of the United States Patent and Trademark Office*